(12) United States Patent
de Avila Ribas et al.

(10) Patent No.: US 11,411,150 B2
(45) Date of Patent: Aug. 9, 2022

(54) ADVANCED SOLDER ALLOYS FOR ELECTRONIC INTERCONNECTS

(71) Applicant: Alpha Assembly Solutions Inc., Waterbury, CT (US)

(72) Inventors: Morgana de Avila Ribas, Bangalore (IN); Pritha Choudhury, Bangalore (IN); Siuli Sarkar, Bangalore (IN); Ranjit Pandher, Plainsboro, NJ (US); Nicholas G Herrick, Edison, NJ (US); Amit Patel, East Brunswick, NJ (US); Ravindra M Bhatkal, East Brunswick, NJ (US); Bawa Singh, Marlton, NJ (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 296 days.

(21) Appl. No.: 16/257,441

(22) Filed: Jan. 25, 2019

(65) Prior Publication Data

US 2019/0157535 A1 May 23, 2019

Related U.S. Application Data

(62) Division of application No. 15/286,759, filed on Oct. 6, 2016, now abandoned.

(51) Int. Cl.
*B23K 35/26* (2006.01)
*C22C 13/02* (2006.01)
(Continued)

(52) U.S. Cl.
CPC .............. *H01L 33/62* (2013.01); *B23K 1/002* (2013.01); *B23K 1/0016* (2013.01);
(Continued)

(58) Field of Classification Search
None
See application file for complete search history.

(56) References Cited

U.S. PATENT DOCUMENTS

| 4,758,407 | A | * | 7/1988 | Ballentine | ............ | B23K 35/262 |
| | | | | | | 420/560 |
| 4,806,309 | A | * | 2/1989 | Tulman | ................ | B23K 35/262 |
| | | | | | | 420/561 |

(Continued)

FOREIGN PATENT DOCUMENTS

| JP | 201281521 | 4/2012 |
| TW | 201408787 | 3/2014 |

(Continued)

*Primary Examiner* — Devang R Patel
(74) *Attorney, Agent, or Firm* — Carmody Torrance Sandak & Hennessry LLP

(57) ABSTRACT

Improved electrical and thermal properties of solder alloys are achieved by the use of micro-additives in solder alloys to engineer the electrical and thermal properties of the solder alloys and the properties of the reaction layers between the solder and the metal surfaces. The electrical and thermal conductivity of alloys and that of the reaction layers between the solder and the -metal surfaces can be controlled over a wide range of temperatures. The solder alloys produce stable microstructures wherein such stable microstructures of these alloys do not exhibit significant changes when exposed to changes in temperature, compared to traditional interconnect materials.

13 Claims, 12 Drawing Sheets

(51) Int. Cl.
*H01L 33/62* (2010.01)
*H01L 23/00* (2006.01)
*B23K 1/00* (2006.01)
*B23K 1/002* (2006.01)
*B23K 1/005* (2006.01)
*B23K 1/08* (2006.01)
*H01L 33/64* (2010.01)

(52) U.S. Cl.
CPC ............ *B23K 1/0056* (2013.01); *B23K 1/085* (2013.01); *B23K 35/262* (2013.01); *C22C 13/02* (2013.01); *H01L 24/13* (2013.01); *H01L 24/29* (2013.01); *H01L 24/32* (2013.01); *H01L 33/641* (2013.01); *H01L 33/647* (2013.01); *H01L 2224/1332* (2013.01); *H01L 2224/13211* (2013.01); *H01L 2224/13313* (2013.01); *H01L 2224/13339* (2013.01); *H01L 2224/13347* (2013.01); *H01L 2224/13355* (2013.01); *H01L 2224/2932* (2013.01); *H01L 2224/29111* (2013.01); *H01L 2224/29211* (2013.01); *H01L 2224/29294* (2013.01); *H01L 2224/29311* (2013.01); *H01L 2224/29313* (2013.01); *H01L 2224/29339* (2013.01); *H01L 2224/29347* (2013.01); *H01L 2224/29355* (2013.01); *H01L 2224/32503* (2013.01); *H01L 2224/32507* (2013.01); *H01L 2924/014* (2013.01); *H01L 2924/01058* (2013.01); *H01L 2924/12041* (2013.01); *H01L 2924/20106* (2013.01); *H01L 2924/351* (2013.01); *H01L 2933/0066* (2013.01)

(56) References Cited

U.S. PATENT DOCUMENTS

| | | | |
|---|---|---|---|
| 5,197,253 | A | 3/1993 | Johnson |
| 5,435,857 | A * | 7/1995 | Han ............... B23K 35/262 148/24 |
| 6,197,253 | B1 * | 3/2001 | Broomfield ............ C22C 13/00 420/561 |
| 6,319,461 | B1 * | 11/2001 | Domi ................ C22C 13/00 420/557 |
| 7,689,130 | B2 | 3/2010 | Ashdown |
| 9,005,330 | B2 | 4/2015 | Shearer et al. |
| 9,175,368 | B2 | 11/2015 | Liu et al. |
| 9,379,288 | B2 | 6/2016 | Choi et al. |
| 2007/0295528 | A1 * | 12/2007 | Nishi .................. C22C 13/02 174/126.4 |
| 2008/0159903 | A1 * | 7/2008 | Lewis ................. C22C 13/00 420/561 |
| 2010/0116376 | A1 * | 5/2010 | Huang ................ C22C 13/00 148/24 |
| 2015/0224604 | A1 | 8/2015 | Choudhury et al. |
| 2015/0305167 | A1 * | 10/2015 | Nakanishi ............ H05K 1/092 174/257 |
| 2016/0023309 | A1 | 1/2016 | Choudhury et al. |
| 2016/0154193 | A1 | 6/2016 | Brukilacchio |

FOREIGN PATENT DOCUMENTS

| | | |
|---|---|---|
| TW | 201410374 | 3/2014 |
| TW | 201422356 A | 6/2014 |
| TW | 201632289 | 9/2016 |
| WO | 2007081775 | 7/2007 |
| WO | 2014057261 | 4/2014 |
| WO | 2014163167 | 10/2014 |

* cited by examiner

ADVANCED SOLDER ALLOYS FOR ELECTRONIC INTERCONNECTS

FIELD OF THE INVENTION

The invention generally relates to a method for improving the electrical and thermal properties of solder alloys used for LED/Power Semiconductors die attach and component attach.

BACKGROUND OF THE INVENTION

There are a wide variety of known soldering techniques in the electronics industry. Wave soldering is a widely used method of mass soldering electronic assemblies. It may be used, for example, for through-hole circuit boards, where the board is passed over a wave of molten solder, which laps against the bottom of the board to wet the metal surfaces to be joined.

Another soldering technique involves printing of the solder paste on the soldering pads on the printed circuit boards followed by placement and sending the whole assembly through a reflow oven. During the reflow process, the solder melts and wets the soldering surfaces on the boards as well as the components.

Another soldering process involves immersing printed wiring boards into molten solder in order to coat the copper terminations with a solderable and protective layer. This solder application process is known as hot-air leveling and the subsequent soldering process is known as solder on pad.

Ball grid array joints or chip scale packages are typically assembled with spheres of solder between two substrates. Arrays of these joints are used to mount chips on circuit boards.

There are a number of requirements for a solder alloy to be suitable for use in wave soldering, SMT (surface mount technology), die attach and ball grid arrays. Most importantly, the alloy must exhibit good wetting characteristics in relation to a variety of substrate materials such as copper, nickel, nickel phosphorus ("electroless nickel"), silver and copper-OSP (organic solderability preservative).

Solder alloys tend to dissolve the substrate and form an intermetallic compound at the interface with the substrate. For example, tin in the solder alloy may react with the substrate at the interface to form an intermetallic compound (IMC) layer. If the substrate is copper, then a layer of Cu6Sn5 may be formed. Such a layer typically has a thickness anywhere from a fraction of a micron to a few microns. At the interface between this layer and the copper substrate an IMC of Cu3Sn may be present. The interface intermetallic layers will tend to grow during aging, particularly at higher temperatures. The thicker intermetallic layers, together with any voids that may have developed, may further contribute to premature fracture of a stressed joint.

Other important factors are: (i) the presence of intermetallics in the alloy itself, which results in improved mechanical properties; (ii) oxidation resistance, which is important in solder spheres, preforms, and powder etc., where deterioration during storage or during repeated reflows may cause the soldering performance to become less than ideal; (iii) drossing rate; and (iv) alloy stability. These latter considerations are important for applications where the alloy is held in a tank or bath for long periods of time or where the formed solder joints are subjected to high operating temperatures for long periods of time.

For environmental and health reasons, there is an increasing demand for lead-free and antimony-free replacements for lead- and antimony-containing conventional alloys. Many conventional solder alloys are based around the tin-copper eutectic composition, Sn-0.7 wt. % Cu. For example, the tin-silver-copper system has been embraced by the electronics industry as a lead-free alternative for soldering materials. One particular alloy, the eutectic alloy SnAg3.0Cu0.5, exhibits a superior fatigue life compared to a Sn—Pb solder material, while maintaining a relatively low melting point of about 217 to 219° C.

In some fields, such as automotive, high power electronics and energy, including LED lighting, for example, it is desirable for solder alloys to operate at high temperatures, for example 150° C. or higher. The SnAg3.0Cu0.5 alloy does not perform well at such temperatures.

Solders used in die attach and other electrical interconnects perform multiple functions such as providing mechanical strength to join the parts together, providing a path for electrical current, or providing a thermal interface as a route for heat generated in the device to dissipate to a heat sink. Physical properties of the solder material such as thermal conductivity, electrical conductivity, tensile strength, shear strength, creep, and its capacity to form a good interface with devices and circuit boards are important factors in determining its overall performance in the real life application. These properties also need to be stable over time under typical operating conditions.

Electronic devices, especially high power devices such as LED and high power amplifiers and switches etc., generate a lot of heat which need to be dissipated. During operation of such devices, the thermal and electrical interface material sees high temperatures for long periods of time. During high temperature operation, the interconnect material also faces high mechanical stress due to coefficient of thermal expansion (CTE) miss-match between the device, substrate and interconnect materials. Therefore, for long life of the device under operation, the interconnect materials as well as the interfaces should have stable mechanical, thermal and electrical properties under these conditions.

Thermal energy in metals and alloys is primarily transported by electrons. In general, metals and alloys show a decrease in thermal conductivity with increasing temperature. This is usually the result of a combination of several factors such as electron-electron scattering, electron-atom scattering, and electron scattering from the grain boundaries within the alloys and at the interfaces. Changes in conductivity are not desirable. The electrical resistivity of metals and alloys can also change with an increase in temperature. Resistivity changes in the solder alloys are also undesirable.

The present invention seeks to remedy at least some of the problems associated with the prior art and provide a commercially acceptable alternative solution to existing solder alloys.

SUMMARY OF THE INVENTION

In accordance with one or more aspects of the present disclosure, a combination of micro additives is used to tailor solder microstructure thereby impacting properties of solder alloys.

It is an object of the current invention to provide a solder alloy with improved electrical properties.

It is an object of the current invention to provide a solder alloy with improved thermal properties.

It is an object of the current invention to provide a solder alloy with improved fatigue life.

It is another object of the current invention to provide low contact resistance in an LED die attach layer.

It is another object of the current invention to provide little to no change in contact resistance of a die attach layer during operation and aging.

It is an object of the current invention to allow for higher efficiency of an LED or any other high-power electronic device at high power operation.

To that end, in one embodiment, the present invention generally relates to a lead-free, antimony-free solder alloy comprising:
(a) 10 wt. % or less of silver
(b) 10 wt. % or less of bismuth
(c) 3 wt. % or less of copper
(d) at least one of the following elements
   up to 1 wt. % of nickel
   up to 1 wt. % of titanium
   up to 1 wt. % of cobalt
   up to 3.5 wt. % of indium
   up to 1 wt. % of zinc
   up to 1 wt. % of cerium
(e) optionally one or more of the following elements
   0 to 1 wt. % of manganese
   0 to 1 wt. % of chromium
   0 to 1 wt. % of germanium
   0 to 1 wt. % of iron
   0 to 1 wt. % of aluminum
   0 to 1 wt. % of phosphorus
   0 to 1 wt. % of gold
   0 to 1 wt. % of gallium
   0 to 1 wt. % of tellurium
   0 to 1 wt. % of selenium
   0 to 1 wt. % of calcium
   0 to 1 wt. % of vanadium
   0 to 1 wt. % of molybdenum
   0 to 1 wt. % of platinum
   0 to 1 wt. % of magnesium
   0 to 1 wt. % of rare earths
(f) the balance tin, together with any unavoidable impurities.

In another preferred embodiment, the present invention relates to a soldered joint comprising a lead-free, antimony-free solder alloy comprising:
(a) 10 wt. % or less of silver
(b) 10 wt. % or less of bismuth
(c) 3 wt. % or less of copper
(d) at least one of the following elements
   up to 1 wt. % of nickel
   up to 1 wt. % of titanium
   up to 1 wt. % of cobalt
   up to 3.5 wt. % of indium
   up to 1 wt. % of zinc
   up to 1 wt. % of cerium
(e) optionally one or more of the following elements
   0 to 1 wt. % of manganese
   0 to 1 wt. % of chromium
   0 to 1 wt. % of germanium
   0 to 1 wt. % of iron
   0 to 1 wt. % of aluminum
   0 to 1 wt. % of phosphorus
   0 to 1 wt. % of gold
   0 to 1 wt. % of gallium
   0 to 1 wt. % of tellurium
   0 to 1 wt. % of selenium
   0 to 1 wt. % of calcium
   0 to 1 wt. % of vanadium
   0 to 1 wt. % of molybdenum
   0 to 1 wt. % of platinum
   0 to 1 wt. % of magnesium
   0 to 1 wt. % of rare earths
(f) the balance tin, together with any unavoidable impurities In yet another preferred embodiment, the present invention relates to a method of soldering, the method comprising the steps of:
a) applying a solder alloy to a substrate, wherein the solder is a lead free or lead free, antimony free solder alloy;
wherein the solder can be applied by wave soldering, Surface Mount Technology (SMT) soldering, die attach soldering, thermal interface soldering, hand soldering, laser and RF induction soldering, rework soldering, lamination, and combinations thereof.

DETAILED DESCRIPTION OF THE PREFERED EMBODIMENTS

Figure 1:
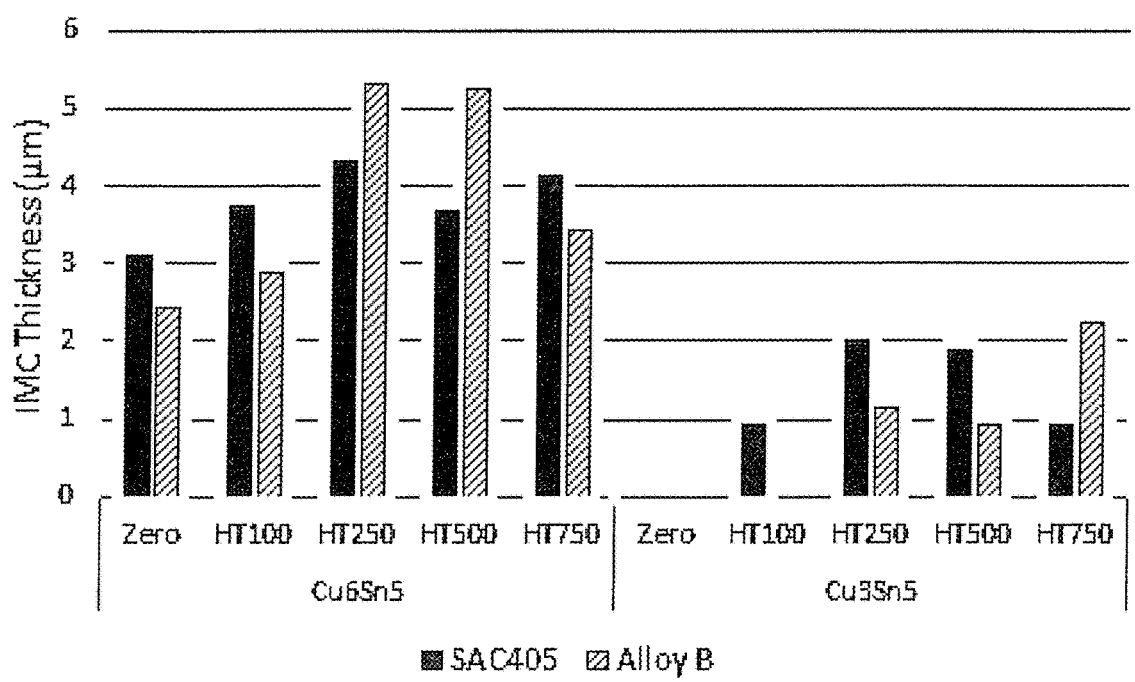
FIG. 1 shows the effect of high temperature storage on the intermetallic thickness.

The invention relates to micro level additions to solder alloys to engineer the electrical and thermal properties for use in the manufacture of electronic components and devices, as well as in electronic assembly and packaging.

The novel solder alloys allow for improved electrical properties in addition to improved thermal fatigue life of the die attach layer. The invention results in lower contact resistance in a die attach layer, lower change in contact resistance during operation and aging of the die attach layer, and higher efficiency of LEDs, especially during high power operation.

The engineered microstructure of finer IMC particles in the solder alloy allows for more uniform distribution of the particles compared to SAC alloys. The smaller size of bulk IMCs and their uniform distribution lowers the electronic scattering at interface between IMCs and the adjoining layers.

The engineered microstructure allows for slower growth of bulk IMCs, controlled interfacial IMC and slower change in microstructure during high temperature operation and temperature cycling. This leads to very little change or degradation in LED performance over its lifetime when the disclosed solder alloys are used to die attach LEDs.

The novel solder alloys result in a lower coefficient of temperature dependence for electrical resistance. The alloys additionally result in a lower coefficient of temperature dependence for effective thermal resistance and effective thermal conductivity. The lower coefficient of temperature dependence for both electrical resistance and effective thermal resistance/conductivity results in lower drift in optical power, wavelength and efficiency of an LED.

The preparation of the solder alloys includes solid solution strengthening whereby the crystalline lattice is distorted by addition of elements within the solubility limit. Aspects of the invention may further comprise methods such as grain refinement, precipitation strengthening and addition of diffusion modifiers. The solder alloy composition can be engineered such that the interfacial intermetallic results in overall improvement in thermal and electrical conductivity performance.

The invention includes a family of interconnect materials compositions including solder alloy compositions that produce stable microstructures. These stable microstructure compositions do not exhibit significant changes when used (over time, operating temperature range, thermal cycling regime, and power loads etc.). Key metrics for evaluating microstructure properties, such as grain size, IMC thickness, creep properties (stress-strain hysteresis characteristics, etc.), and solder alloys, remain fairly constant when compared to traditional interconnect materials such as SAC 305.

The stable microstructures exhibit stable thermal and electrical properties such as stable electrical resistance values. Stable electrical resistance values minimize variation in the output variable and yield stable outputs such as sustained electrical efficiency over time. This is important for use in power conversion devices. An example of such electrical efficiency is sustained lumen output (in case of LED and laser diodes) with minimal lumen depreciation over time.

The invention uses a combination of micro level additions to the solder alloys to engineer the bulk solder microstructure. These additions are so small that that they do not have significant impact on the solder melting behavior but can have significant impact on other properties. New alloys are designed using a combination of solid solution strengthening, grain refinement, precipitate strengthening and diffusion modifiers.

In solid solution strengthening, the crystalline lattice is distorted due to alloying elements addition within the solubility limit. Such lattice distortion generates stress fields that interact with dislocations present in the material. Strengthening arises from impeding dislocation motion, which prevents plastic deformation. Thus elements such as Bi and Sb are added to a Sn based matrix, up to the limit in which a new phase would form, strengthening the alloy microstructure. Since dislocation movement is interrupted by grain boundaries, reducing grain size limits the dislocation movement, which results in higher mechanical strength of the alloy. For example, Ge and rare earths are used for grain refinement of alloys. Similarly, in precipitation strengthening, alloying elements with lower solubility in the matrix form precipitated intermetallics. Such intermetallics desirably are uniformly distributed within the grains in the Sn matrix, pinning the dislocations and, consequently, improving the mechanical strength of the alloy. Examples of such additions are Ag, Cu, Ti, Co, Ni, Ce and Mn.

The growth of interfacial IMC and interfacial voids can be controlled through addition of diffusion modifiers to the solder during the alloy development. Similarly, the mechanical properties of the bulk solder alloy can be controlled through the formation of intermetallics and microstructure refinement. The choice of which alloying element(s) to add depends on its relation with the alloy system and the resulting thermodynamics and kinetics properties. The invention shows that interfacial intermetallics are not only responsible for the actual bond between the solder and the substrate, but also can be designed to improve thermal and electrical conductivity.

Although brittle in nature, intermetallics have a quite unique behavior when subjected to extended periods under high temperature condition. It is shown here that thermal and electrical conductivity can be improved under high temperature operation depending on the alloy that is used. It is also shown that a solder alloy composition can be engineered such that its interfacial intermetallics result in improved thermal and electrical conductivity. $Cu_6Sn_5$ and $Cu_3Sn$ intermetallics form at the interface between bulk solder alloy and copper substrate. The individual values of thermal conductivity and electrical resistivity values of alloy A, alloy B, SAC305, $Cu_6Sn_5$ and $Cu_3Sn$ are shown in Table 1. $Cu_3Sn$ has higher thermal conductivity and lower electrical resistivity than SAC305 bulk alloy. Thus, in the case of a solder joint, the interfacial intermetallics play an important role in achieving high thermal and electrical conductivity.

TABLE 1

Thermal conductivity and electrical resistivity of alloys and intermetallics

| | Thermal Conductivity (W/mK) | Electrical Resistivity ($\mu\Omega \cdot cm$) |
|---|---|---|
| Alloy A | 55.2 | 16.4 |
| Alloy B | 59.2 | 14.2 |
| SAC305 | 64 | 11.8 |
| $Cu_3Sn$ (Ref. 1) | 70.4 | 8.8 |
| $Cu_6Sn_5$ (Ref. 1) | 34.1 | 17.5 |

Reference 1: H. P. FL Frederikse, R. J. Fields, and A. Feldman, "Thermal and electrical properties of copper-tin and nickel-tin intermetallics". J. Appl. Phys. 72 (7), 1 Oct. 1992.

The effect of high temperature storage at 175° C. on intermetallics thickness was investigated by evaluating solder joints on copper metallized dies, as shown in FIG. 1. Initially only $Cu_6Sn_5$ is observed, but upon time a second intermetallic $Cu_3Sn$ is also observed. As shown in Table 1, these intermetallics possess different thermal and electrical conductivities. Thus, the contribution of each intermetallic is calculated (FIG. 1) in the total intermetallic thickness and correlated with the thermal conductivity and electrical resistivity values shown in Table 1.

Figure 2:
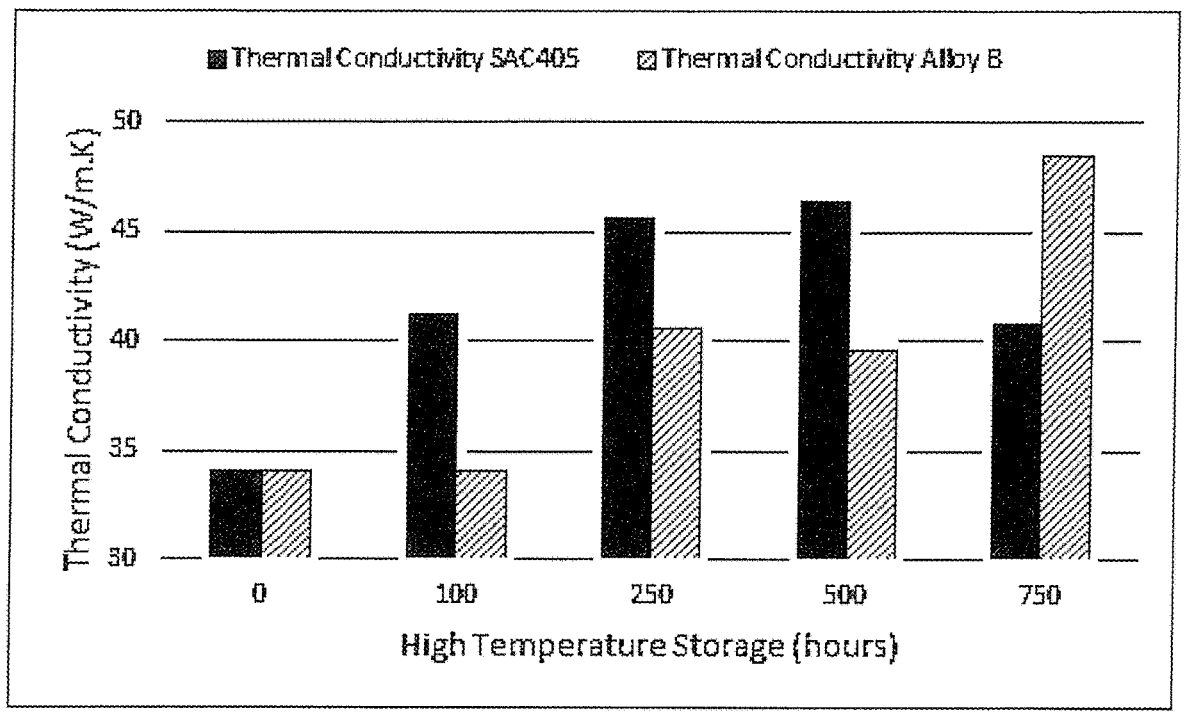
FIG. 2 shows evolution of thermal conductivity and intermetallic during high temperature storage.
Figure 3:
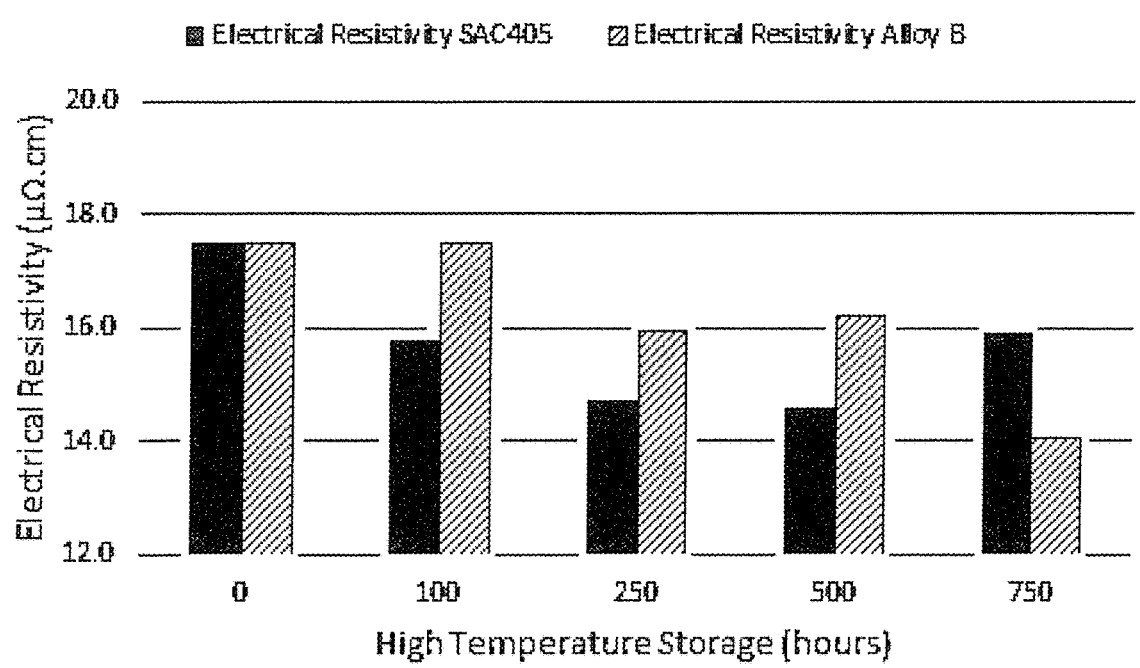
FIG. 3 shows evolution of electrical resistivity and intermetallic during high temperature storage.

Both FIGS. 2 and 3 show the estimated values of thermal conductivity and electrical resistivity of SAC305 and alloy B during high temperature storage. Similar behavior was also observed for samples that were subjected to thermal cycling, i.e., alternated exposure to cold and hot cycles during a period of time. Unlike SAC305, Alloy B possesses the unique characteristic of increased thermal conductivity and decreased electrical conductivity with the increase of time under high temperature storage. Also to note, is that SAC305 was used as the benchmark because it has similar silver content than alloy B. Thus, the intermetallic characteristics of alloy B are not related to the alloy composition of an ordinary Sn—Ag—Cu alloy, but to its unique alloying additions.

Figure 4:
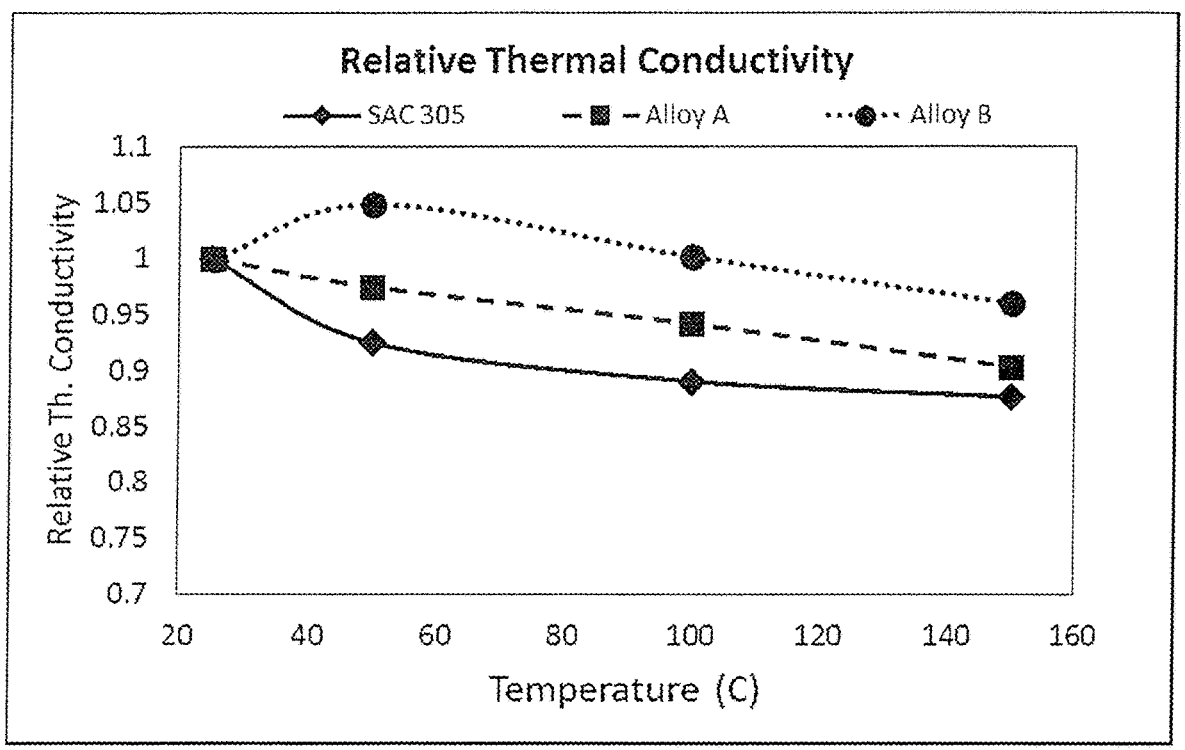
FIG. 4 shows temperature dependence of thermal conductivity of a common Pb-free solder alloy SAC305 and two new solder alloys.

Change in Thermal Conductivity With Temperature:

As shown in FIG. 4, thermal conductivity of SAC305 drops by about 13% when temperature increases from 25C to 150C. Under the same conditions, thermal conductivity of new Alloy A drops by about 9% and Alloy B's thermal conductivity drops by only 4%. Therefore if alloy B is used for die attach, or component attach in a high power LED assembly, parts assembled with alloy B will show much less variation in LED performance at high current operation. In other words, there will be a smaller drift in LE wavelength, maintained efficiency and the LEDs can be operated at higher power density. Similarly, if this alloy is used for die attach and other parts assembly of the any other high power electronics components, similar performance advantages will be observed.

Figure 5:
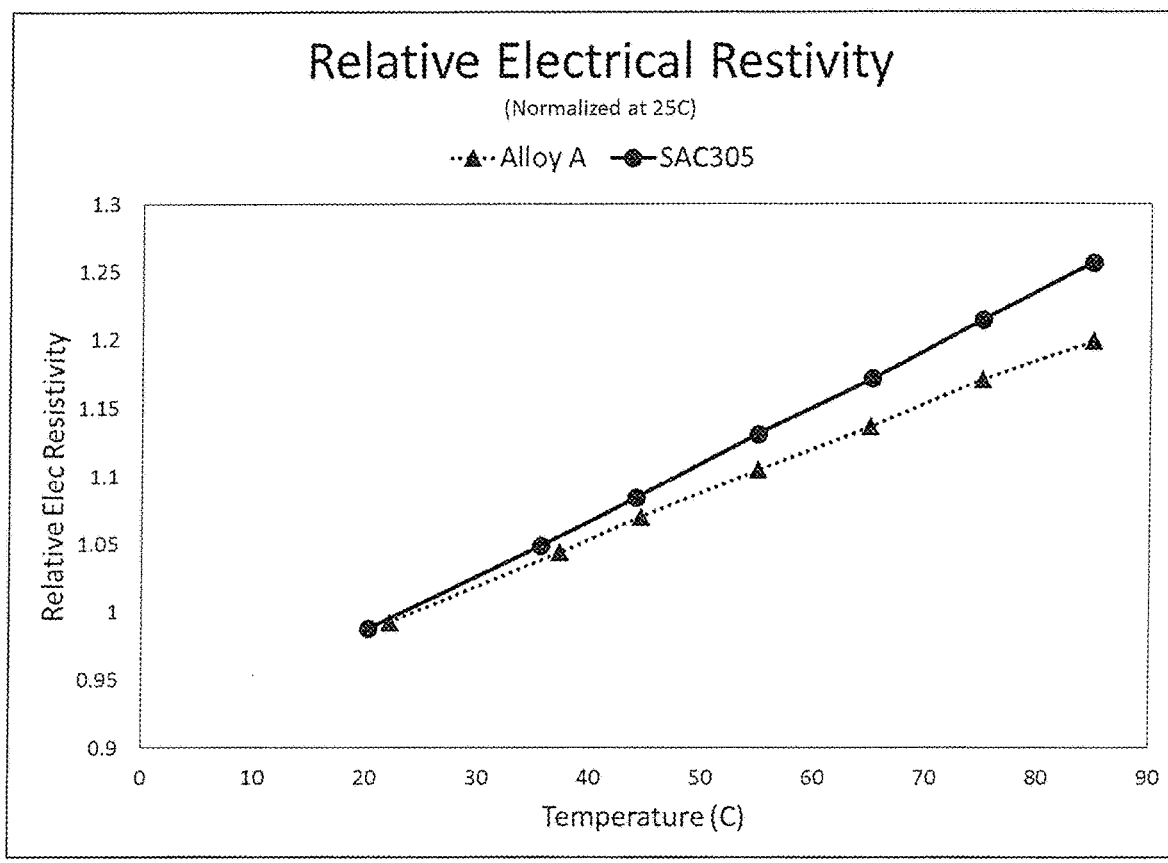
FIG. 5 shows temperature dependence of the bulk electrical resistance of a common Pb-free solder alloy SAC305 and a new solder alloy A.

Change in Electrical Conductivity With Temperature:

As shown in FIG. 5, the electrical resistivity of the SAC305 solder alloy increases by about 27% when temperature increases from 25C to 85C while under the same conditions, increase in electrical resistivity of the new Alloy A is less than 20%. If alloy A is used in die attach and for making electrical interconnects in a high-power LED assembly, it will show a much less variation in the LED performance under high current density operation and will operate at a higher efficacy/efficiency.

High-Power LED Performance:

Forty-eight mid-power LEDs were assembled on flexible PET substrates using SAC305, Alloy A, and Alloy B as the package attach material (approximately 16 each). These LEDs were evaluated in an integrating sphere to measure their optical, electrical, and thermal performance. After initial analysis, the LEDs were placed in an air-to-air thermocycling chamber cycling from −40 to 125 C with a dwell time of 30 minutes. Every 250 thermocycles, up to 1500, these LEDs were removed and re-evaluated in the integrating sphere. Data reported here is absolute measured values and values normalized to each LED's pre-temperature cycling performance.

Figure 6:
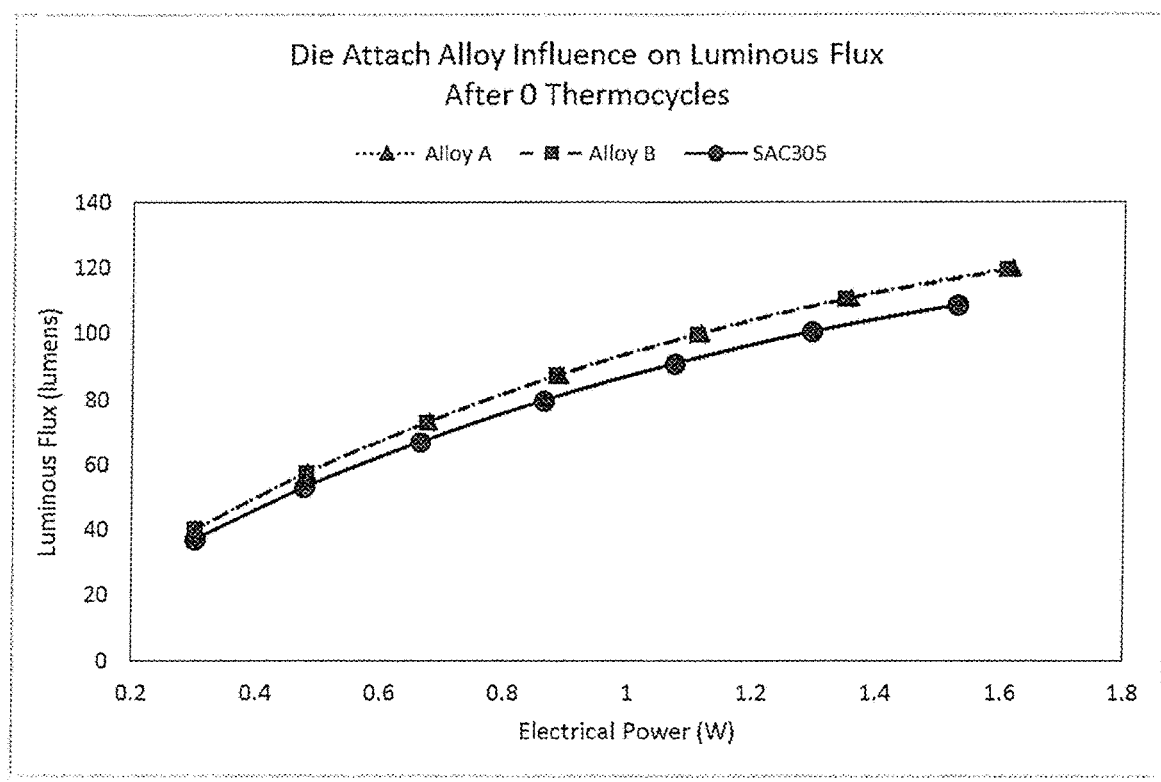
FIG. 6 shows luminous flux of LEDs assembled with SAC305, Alloy A and Alloy B as a function of the driving electrical power. This is initial performance of as soldered LEDs before any aging or temperature cycling.
Figure 7:
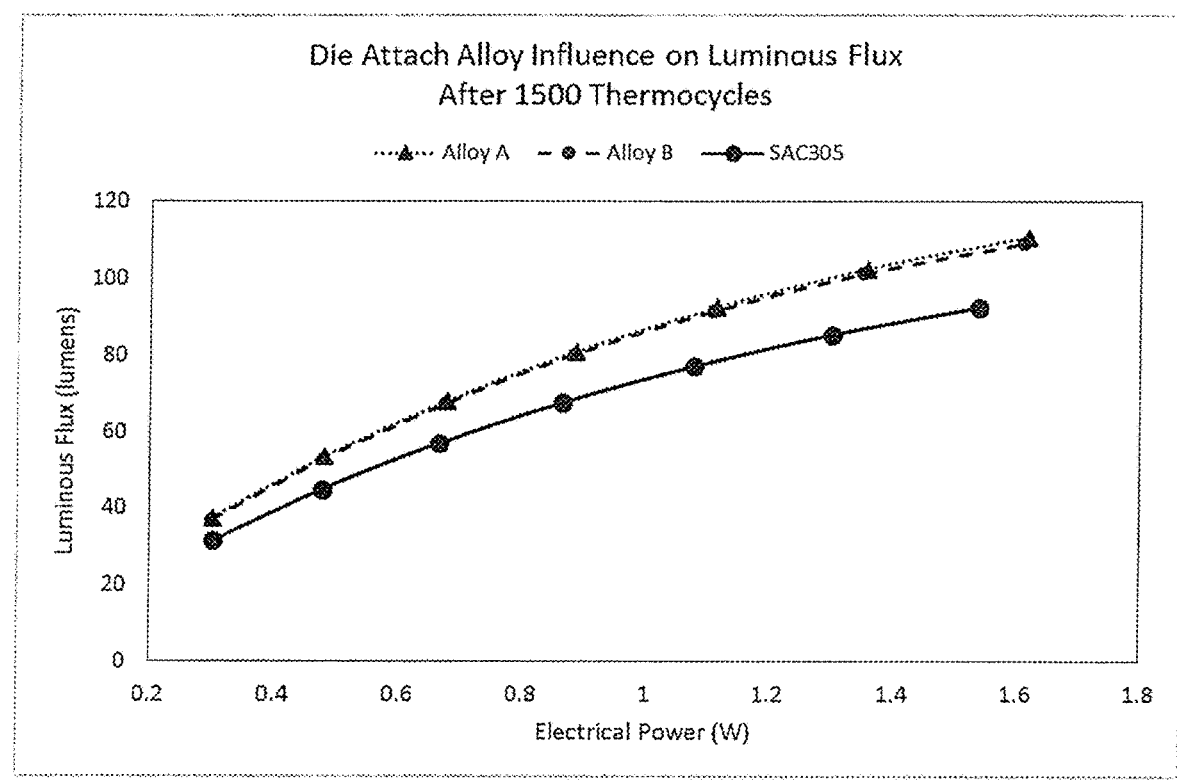
FIG. 7 shows luminous flux of LEDs assembled with SAC305, Alloy A and Alloy B as a function of the driving electrical power. The performance of the LEDs is shown after 1500 temperature cycles.
Figure 8:
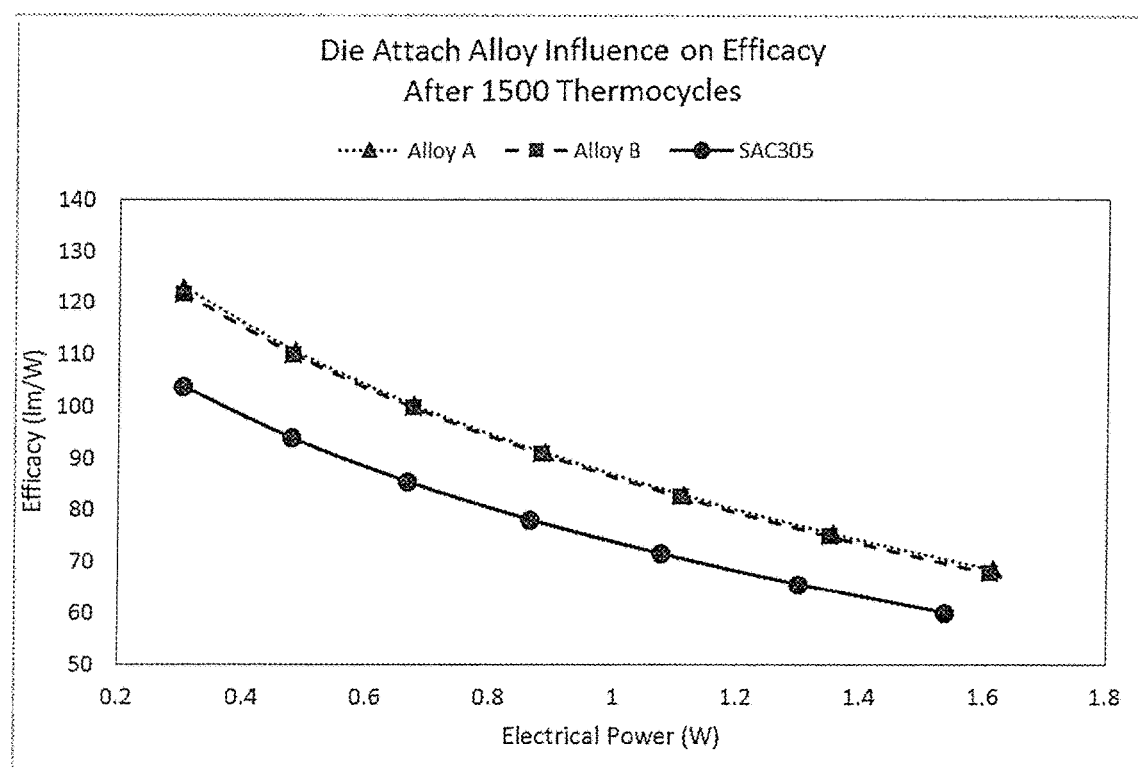
FIG. 8 shows luminous efficacy of three sets of LEDs after 1500 temperature cycles at various drive currents.

FIG. 6 shows luminous flux of LEDs assembled with SAC305, Alloy A and Alloy B as a function of the driving electrical power. This is initial performance of as soldered LEDs before any aging or temperature cycling shows the LEDs with Alloy A and Alloy B show about 10% higher luminous flux than LEDs with SAC305. After 1500 temperature cycles alloys A and B exhibit approximately 19% higher luminous flux at high power than SAC305 as shown in FIG. 7. As shown in FIG. 8, a similar difference in performance is observed in luminous efficacy as well. After 1500 temperature cycles, alloys A and B exhibit approximately 12-18% higher luminous efficacy than SAC305.

Figure 9:
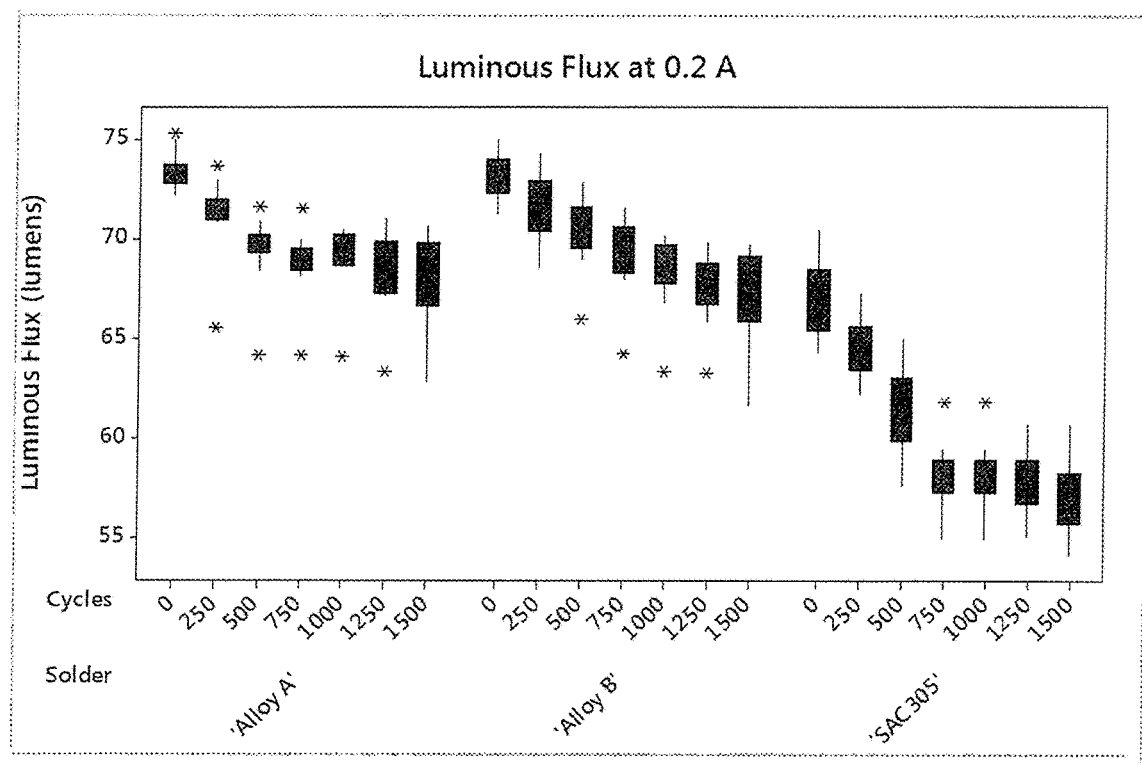
FIG. 9 shows luminous flux of LEDs at 0.2A drive current as a function of temperature cycling. LEDs were assembled with SAC305, Alloy A and Alloy B.

As shown in FIG. 9, LEDs assembled with Alloys A and B show higher luminous flux output in the beginning (0 cycles) than those assembled with SAC305. In addition, these LEDs also show smaller drop in luminous flux during temperature cycling than LEDs assembled with SAC305.

Figure 10:
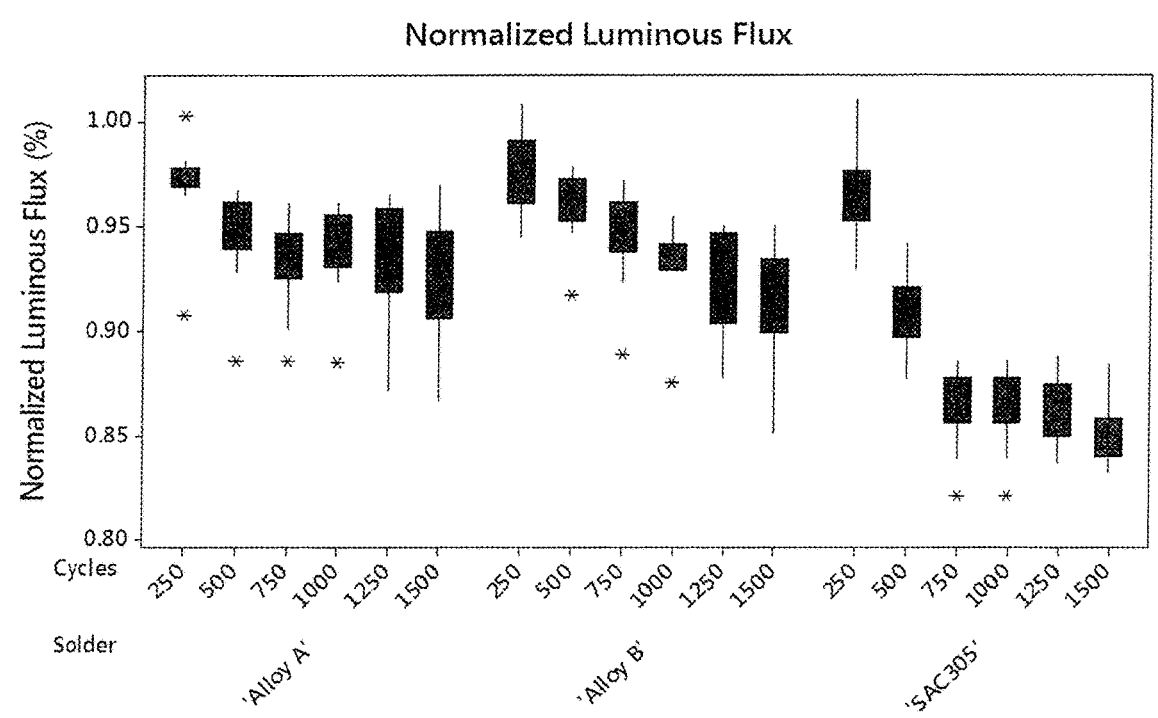
FIG. 10 shows normalized luminous flux of LEDs at 0.2A drive current as a function of temperature cycling. The LEDs were assembled with SAC305, Alloy A and Alloy B.

The change in flux output becomes even clearer when the normalized flux is compared for each set of LEDs as plotted in FIG. 10. SAC305 LED show about 17% drop while in luminous flux over 1500 cycles while the drop for Alloy A and Alloy B LEDs is about 8-9% over the same number of cycles.

Figure 11:
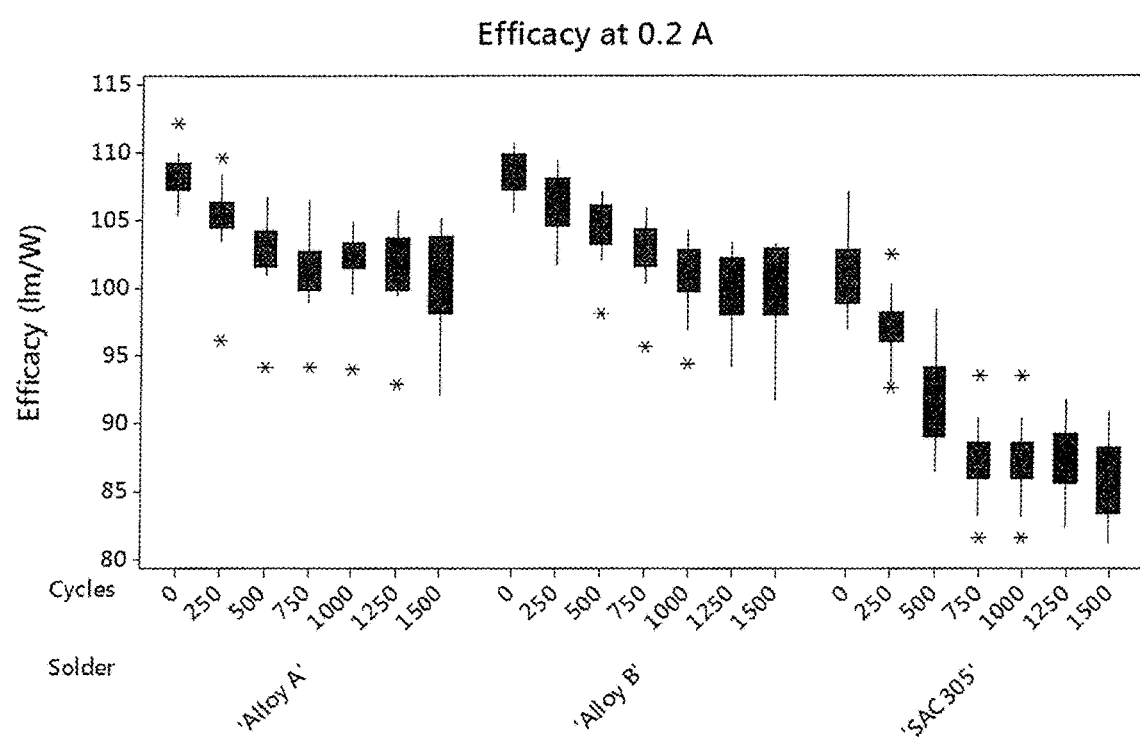
FIG. 11 shows changes in efficacy of three sets of LEDs assembled with SAC305, Alloy A and Alloy B under temperature cycling.

Similarly, luminous efficacy of these LEDs also shows higher value for LEDs assembled with Alloys A and B as compared SAC305. In addition, as shown in FIG. 11, the drop in efficacy after temperature cycling is also reduced.

Figure 12:
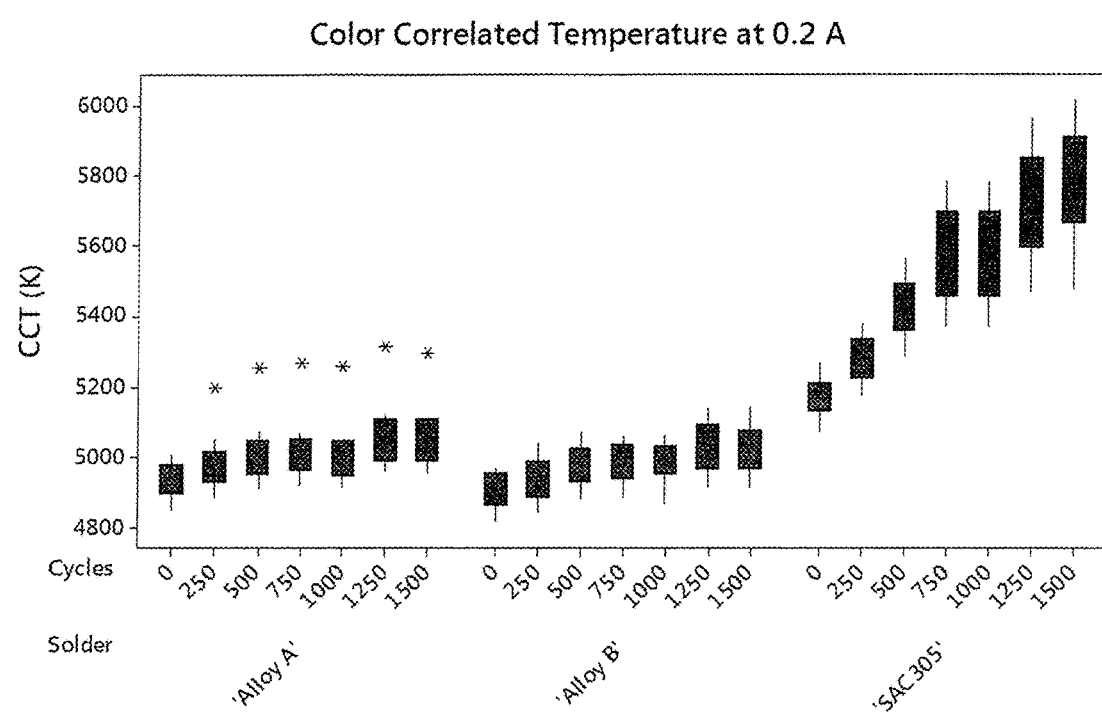
FIG. 12 shows Color Correlated Temperature (CCT) over 1500 cycles of LEDs assembled with SAC305, Alloy A and Alloy B. CCT was recorded at 0.2A drive current.

Another measure of LED performance is its Color Correlated Temperature (CCT) and its stability over the life of the LED. FIG. 12 shows CCT of three sets of LEDs assembled with SAC305, Alloy A and Alloy B solders over 1500 temperature cycles. LEDs assembled with SAC305 show more than 15% change in CCT while those assembled with Alloy A and alloy B show a less than 5% change in CCT over 1500 temperature cycles. These results also point to stability of the mechanical, thermal and electrical properties of these alloys under high stress operating conditions.

Alloy Examples:

Examples of the inventive alloys are shown in Table 1 with the balance of each alloy being tin.

| Alloys | Elements wt % | | | | | | | | | | | | | |
| --- | --- | --- | --- | --- | --- | --- | --- | --- | --- | --- | --- | --- | --- | --- |
| | Ag | Bi | Cu | Ni | Co | Ge | Mn | Ti | Ce | In | La | Nd | Sb | Sn |
| A | 3.63 | 3.92 | 0.76 | 0.18 | — | — | — | — | — | — | — | — | — | balance |
| B | 3.81 | 3.94 | 0.8 | 0.25 | — | — | — | — | 0.04 | — | — | — | — | balance |
| C | 3.8 | 2.98 | 0.7 | 0.1 | — | — | — | 0.01 | — | — | — | — | — | balance |
| D | 3.85 | 3.93 | 0.68 | 0.22 | — | — | — | — | 0.078 | — | — | — | — | balance |
| E | 3.86 | 3.99 | 0.63 | 0.16 | — | — | — | 0.042 | — | — | — | — | — | balance |
| F | 3.82 | 3.96 | 0.6 | 0.16 | 0.042 | — | — | — | — | — | — | — | — | balance |
| G | 3.9 | 3 | 0.6 | 0.12 | — | — | 0.006 | — | — | — | — | — | — | balance |
| H | 3.83 | 3.93 | 0.63 | 0.15 | — | 0.006 | — | — | — | — | — | — | — | balance |
| I | 4.2 | 3.99 | 0.63 | 0.18 | — | — | — | — | — | 3.22 | — | — | — | balance |
| J | 3.91 | 2.9 | 0.72 | 0.2 | — | — | — | — | 0.04 | — | — | — | — | balance |
| K | 3.87 | 3.02 | 0.61 | 0.14 | — | — | — | — | — | — | 0.038 | — | — | balance |
| L | 3.86 | 3.99 | 0.64 | 0.14 | — | — | — | — | — | — | — | 0.044 | — | balance |
| M | 3.94 | 3.92 | 0.7 | 0.12 | 0.023 | — | — | — | — | — | — | — | — | balance |
| N | 3.72 | 5.1 | 0.52 | 0.1 | — | — | — | — | — | — | — | — | — | balance |
| P | 3.8 | 3 | 0.7 | 0.15 | — | — | — | — | — | — | — | — | 1.4 | balance |

The invention is generally disclosed herein using affirmative language to describe the numerous embodiments. The invention also specifically includes embodiments in which particular subject matter is excluded, in full or in part, such as substances or materials, method steps and conditions, protocols, procedures, assays or analysis. Thus, even though the invention is generally not expressed herein in terms of what the invention does not include aspects that are not expressly included in the invention are nevertheless disclosed herein.

A number of embodiments of the invention have been described. Nevertheless, it will be understood that various modifications may be made without departing from the spirit and scope of the invention.

The invention claimed is:

1. A lead-free solder alloy consisting of:
   (a) from greater than 3.6 to 10 wt. % silver;
   (b) from greater than 0 to 10 wt. % bismuth;
   (c) from greater than 0 to 3 wt. % copper;
   (d) from greater than 0 to 1.4 wt. % antimony;
   (e) from greater than 0 to 1 wt. % nickel;
   (f) the balance tin, together with any unavoidable impurities.

2. A soldered joint comprising a lead-free solder alloy consisting of:
   (a) from greater than 3.6 to 10 wt. % of silver;
   (b) from greater than 0 to 10 wt. % of bismuth;
   (c) from greater than 0 to 3 wt. % of copper;
   (d) from greater than 0 to 1.4 wt. % of antimony;
   (e) from greater than 0 to 1 wt. % of nickel;
   (f) the balance tin, together with any unavoidable impurities.

3. A method of soldering, the method comprising the steps of:
   a) applying a solder alloy to a substrate, wherein the solder is a lead free solder alloy according to claim 1; wherein the solder can be applied by wave soldering, Surface Mount Technology (SMT) soldering, die attach soldering, thermal interface soldering, hand soldering, laser and RF induction soldering, rework soldering, lamination, and combinations thereof.

4. The method according to claim 3, wherein the substrate is a printed circuit board, flexible substrate, a metal core circuit board, a leadframe, a direct bond copper on $Al_2O_3$ or AlN.

5. The method according to claim 3, wherein the substrate is an LED component, LED die, and LED package, a high power switch, a high power amplifier or any other electronic component.

6. The method according to claim 5, wherein the LED component exhibits less than 5% change in CCT over 1500 temperature cycles.

7. The method according to claim 3, wherein the solder alloy has a thermal conductivity drop of less than 10% when the temperature of the alloy reaches 150° C.

8. The method according to claim 3, wherein the electrical resistivity of the solder alloy increases less than 20% when the temperature of the alloy reaches 85° C.

9. The method according to claim according to claim 5, wherein the LED with the solder alloy applied exhibits at least 10% higher luminous efficacy compared to an LED with SAC305.

10. The method according to claim 5 wherein the LED with the solder alloy applied shows a smaller drop in luminous flux during temperature cycling compared to an LED with SAC305.

11. The method according to claim 5, wherein the solder is applied to the LED using die attach.

12. The lead-free solder alloy of claim 1, wherein the alloy has melting point of 200 to 222 ° C.

13. The solder alloy of claim 1, wherein the alloy is in the form of a stick, a solid or flux cored wire, a foil or strip, or a powder or paste (powder plus flux blend), or solder spheres for use in ball grid array joints or chip scale packages, or other pre-formed solder pieces, with or without a flux core or a flux coating.

* * * * *